United States Patent
Kim et al.

(10) Patent No.: US 7,491,572 B2
(45) Date of Patent: Feb. 17, 2009

(54) METHOD FOR FABRICATING AN IMAGE SENSOR MOUNTED BY MASS REFLOW

(75) Inventors: Jong-Heon Kim, Choongcheongbuk-Do (KR); Chi-Jung Song, Daejeon (KR)

(73) Assignee: Nepes Co., Ltd., Chungcheongbuk-Do (KR)

(*) Notice: Subject to any disclaimer, the term of this patent is extended or adjusted under 35 U.S.C. 154(b) by 239 days.

(21) Appl. No.: 10/574,316

(22) PCT Filed: Sep. 30, 2004

(86) PCT No.: PCT/KR2004/002507

§ 371 (c)(1),
(2), (4) Date: May 15, 2006

(87) PCT Pub. No.: WO2005/031875

PCT Pub. Date: Apr. 7, 2005

(65) Prior Publication Data

US 2007/0085180 A1   Apr. 19, 2007

(30) Foreign Application Priority Data

Oct. 1, 2003   (KR) ............ 10-2003-0068283

(51) Int. Cl.
*H01L 21/00* (2006.01)
*H01L 31/0328* (2006.01)

(52) U.S. Cl. ........................ 438/82; 257/186
(58) Field of Classification Search ............ 438/7, 438/57, 28–30, 65, 69, 82; 257/80, 98, 186, 257/229
See application file for complete search history.

(56) References Cited

U.S. PATENT DOCUMENTS

| 5,792,374 A | * | 8/1998 | Yang et al. ............. 216/24 |
| 6,066,440 A | * | 5/2000 | Araki et al. ............ 430/354 |
| 2001/0050721 A1 | | 12/2001 | Miyake |
| 2006/0151847 A1 | * | 7/2006 | Kwon et al. ............ 257/433 |

FOREIGN PATENT DOCUMENTS

| CN | 1349120 | 5/2002 |
| JP | 2001068654 | 3/2001 |
| KR | 10-2003-41735 A | 5/2003 |
| KR | 10-2003-69321 A | 8/2003 |
| WO | WO00/22814 | 4/2000 |

OTHER PUBLICATIONS

First Notification of Office Action issued Jul. 25, 2008 corresponding to Chinese Patent Application No. 200480028857.9.

* cited by examiner

*Primary Examiner*—Calvin Lee
(74) *Attorney, Agent, or Firm*—Marger Johnson & McCollom PC

(57) ABSTRACT

A package for semiconductor image pickup device is provided. The package is fabricated by using flip chip bumping. During deposition process of forming a metallic bonding layer and a metal layer for plating, a surface of a semiconductor image pickup device is maintained at the range between room temperature and 200° C. in accordance with a first embodiment. A polymer layer for preventing stress from generating can absorb stress generated during the deposition process in accordance with a second embodiment. According to the present invention, a functional polymer layer on the surface of a semiconductor image pickup device can be prevent from being deteriorated in its properties and from transforming at its surface.

23 Claims, 13 Drawing Sheets

METHOD FOR FABRICATING AN IMAGE SENSOR MOUNTED BY MASS REFLOW

BACKGROUND OF THE INVENTION

This application claims the priorty of International Application No. PCT/KR2004/002507, filed on Sep. 30, 2004 and Korean Application No. 2003-68283, filed Oct. 1, 2003 in the Korean Intellectual Property Office, the disclousure of which is incorporated herein in its entirety by reference.

1. Field of the Invention

The present invention relates to a structure of a package for a semiconductor image pickup device and a fabrication method thereof, and more particularly, to a structure of a package for a semiconductor image pickup device which is suitable for preventing the optical characteristics of the package for the semiconductor image pickup device from being deteriorated due to a damage of the surface of the semiconductor image pickup device in case where the package for the semiconductor image pickup device is fabricated by using flip chip bumping, and a fabrication method thereof.

2. Description of the Background Art

Generally, a semiconductor image pickup device is referred to as an image sensor chip or solid state image pickup device. They pick up the image of an object by means of a photoelectric transducer converting the image of an object into an electric signal and a charged-coupled device transmitting the electric signal converted by the photoelectric transducer and then output it as an electric signal.

In order to package the semiconductor image pickup device to a ceramic substrate, a general purpose wire bonding method is employed.

The aforementioned semiconductor image pickup device and the package of the semiconductor image pickup device employing the wire bonding method will be described in detail below with reference to the accompanying drawings.

FIG. 1 is an exemplified view showing the planar construction of a general semiconductor image pickup device. As shown therein, the semiconductor image pickup device 10 is provided at the center with an image sensing unit 20 converting the image of an object into an electrical signal and transmitting the converted electrical signal, and provided along the edges of the image sensing unit 20 with a plurality of electrode pads 30 receiving the electrical signal of the image sensing unit 20.

FIG. 2 is an exemplified view showing the sectional construction of the package for the semiconductor image pickup device employing the wire bonding method. As shown therein, the package for the semiconductor image pickup device comprises: a semiconductor image pickup device 110 attached on the middle top part of a first substrate 100 by means of a first adhesion layer 101; a second substrate 120 attached to the edges of the first substrate 100 by means of the first adhesion layer 101 so as to be spaced from the semiconductor pickup device 110 at a predetermined interval; a plurality of conductive wires 130 electrically connecting a plurality of first electrode pads 111 provided on the edges of the semiconductor image pickup device 110 and a plurality of second electrode pads 121 provided on the second substrate 120; a plurality of leads 140 extending to both sides of the top surface of the second substrate 120 from both sides of the bottom surface of the first substrate 100; supports 150 formed on the top part of the leads 140 provided on the top surface of the second substrate 120; and a glass plate 160 attached to the top part of the supports 150 by means of a second adhesion layer 102.

FIG. 3 is an exemplified view showing the module of a semiconductor image sensor in which a lens unit is coupled to the package of the semiconductor image pickup device as shown in FIG. 2. As shown therein, the package 200 for the semiconductor image pickup device as shown in FIG. 2 is provided on a module substrate 210, and a lens unit 220 is provided on the top part of the package 200 for the semiconductor image pickup device. At this time, the lens unit 220 is held by a lens holder 230 supported by the module substrate 200 and is provided on the top part of the package 200 for the semiconductor image pickup device 200.

The module size of the semiconductor image sensor as described above is entirely dependent upon the size of the package for the semiconductor image pickup device, and the package for the semiconductor image pickup device employing the wire bonding method, as shown in FIG. 2, has a problem that the package size of the semiconductor image pickup device gets bigger in comparison to the size of the semiconductor image pickup device 110, as the first electrode pads 111 of the semiconductor image pickup device 110 and the second electrode pads 121 of the second substrate 120 spaced from the semiconductor image pickup device 110 at a predetermined interval are electrically connected, thereby failing to cope with the miniaturization trend in product.

Further, there is another problem that a wire bonding process, a plastic molding process, a ceramic process, etc. are needed in order to fabricate the package for the semiconductor image pickup device by means of wire bonding, which causes a time delay and deteriorates the productivity.

To solve the above problems of the wire bonding method, a method for fabricating a package for a semiconductor image pickup device using a flip chip bumping has been recently proposed.

Generally, the method for fabricating the package for a semiconductor device using the flip chip bumping comprises: a thin film step of selectively exposing electrode pads of the semiconductor device and then depositing a metallic bonding layer and a metal layer for plating thereto; a photographic step of forming a photosensitive material selectively exposing the regions where the electrode pads of the semiconductor device are formed; a metal plating step of forming a bump on the top part of the metal layer for plating of the regions where the electrode pads are formed; an etching step of removing the photosensitive material and then removing the metal layer for plating of the regions where no bump is formed and the metallic bonding layer; and a heat treatment step of adjusting the hardness of the bump according to the purpose of use.

As described above, the respective steps of fabricating the package for the semiconductor device using the flip chip bumping are performed under the temperature condition of more than a room temperature, especially, the thin film process of depositing a metallic bonding layer and a metal layer for plating is performed under the condition of a high temperature more than 300° C.

Generally, a silicon nitride film or silicon oxide film of ceramic materials is formed on the surface of the semiconductor device to protect microcircuits formed inside the semiconductor device.

However, in case where the semiconductor device requires a specific purpose, for example, the mechanical protection, electrical property (dielectric property) enhancement, chemical protection of the semiconductor device surface or the optical characteristics thereof, inorganic matters, such as polymer, are formed on the surface of the semiconductor device. At this time, the inorganic matters, such as polymer, formed on the surface of the semiconductor device are weak in mechanical resistance and heat resistance in comparison with ceramic materials, such as the above-mentioned silicon nitride film or silicon oxide film.

Generally, the polymer formed on the surface of the semiconductor device is classified into an imide type and an epoxy type. The range of the glass transition temperature (Tg) within which the physical properties of the polymer are abruptly changed is 100 to 350° C.

Further, the tensile strength at which the polymer formed on the surface of the semiconductor device can endure without deformation is about a maximum of 400 MPa. The higher the temperature becomes, the lower the maximum tensile strength at which the polymer formed on the surface of the semiconductor device can endure without deformation becomes.

Meanwhile, a semiconductor image pickup device, which is a representative functional device the surface of which a polymer material having optical characteristics is formed on, has a polymer layer comprised of a planarization layer, a color filter layer and a micro lens stacked on the surface thereof. At this time, the color filter layer is very weak in temperature condition and thus the properties thereof are deteriorated at a high temperature more than 250° C.

Further, the polymer layer comprised of a planarization layer, a color filter layer and a micro lens stacked on the surface of the semiconductor image pickup device may be deteriorated in mechanical strength even at a temperature of 250° C. That is, in case of fabricating a package for the semiconductor image pickup device with the polymer layer stacked thereto using the aforementioned flip chip bumping method, even if the temperature condition of the thin film step of depositing a metallic bonding layer and a metal layer for plating was controlled to about 250° C. or so, the stress of a thin film generated in the deposition step exceeds the maximum tensile strength (400 MPa) at which the polymer material can endure without deformation and becomes more than 500 MPa, which leads to the deformation of the surface of the semiconductor image pickup device and thus the generation of a crack or wrinkle.

Therefore, conventionally, the semiconductor image pickup device, a representative functional device the surface of which a polymer material is formed on, has a problem that it is difficult to fabricate a package for the semiconductor image pickup device by means of flip chip bumping.

SUMMARY OF THE INVENTION

Therefore, an object of the present invention is to provide a structure of a package for a semiconductor image pickup device which is suitable for preventing the optical characteristics of the package for the semiconductor image pickup device from being deteriorated due to a damage of the surface of the semiconductor image pickup device in case where the package for the semiconductor image pickup device is fabricated by using flip chip bumping, and a fabrication method thereof.

In a first embodiment to achieve the object of the present invention, there is provided a structure of a package for a semiconductor image pickup device, comprising: a semiconductor image pickup device having at least one functional polymer layer formed on the surface of an image sensing unit at the center thereof and a plurality of electrode pads selectively exposed by an insulating film formed along the edges; at least one metal thin film layer formed on the respective top parts of the exposed electrode pads; a bump formed on the respective top parts of the metal thin film layer; a printed circuit board provided with an opening so as to expose the functional polymer layer and a plurality of electrode pads bonding to the bump via an anisotropic conductive polymer; and a glass filter attached on the printed circuit board and filtering the light incident upon the functionally polymer layer through the opening.

In the first embodiment to achieve the object of the present invention, there is provided a fabrication method of a structure of a package for a semiconductor image pickup device, comprising the steps of: forming an insulating film on the surface of a semiconductor image pickup device and then selectively etching the insulating film so as to expose electrode pads formed on the edges of the semiconductor image pickup device; forming at least one functional polymer layer on an image sensing unit formed at the center of the semiconductor image pickup device; forming at least one metal thin film layer on the top part of the resultant material while adjusting the surface temperature of the semiconductor image pickup device at the range between a room temperature and 200° C.; forming a photosensitive film on the top part of the metal thin film layer and then light-exposing and developing the same so as to expose the metal thin film layer of the regions where the electrode pads of the semiconductor image pickup device are formed; forming a bump on the top part of the metal thin film layer exposed to the regions where the electrode pads of the semiconductor image pickup device are formed; and removing the photosensitive film and then etching the metal thin film layer using the bump as a mask.

In a second embodiment to achieve the object of the present invention, there is provided a fabrication method of a structure of a package for a semiconductor image pickup device, comprising the steps of: forming an insulating film on the surface of a semiconductor image pickup device and then selectively etching the insulating film so as to expose electrode pads formed on the edges of the semiconductor image pickup device; forming at least one functional polymer layer on an image sensing unit formed at the center of the semiconductor image pickup device; forming a stress preventing polymer layer on the image sensing unit where the functionally polymer layer is formed; forming at least one metal thin film layer on the top part of the resultant material; forming a photosensitive film on the top part of the metal thin film layer and then light-exposing and developing the same so as to expose the metal thin film layer of the regions where the electrode pads of the semiconductor image pickup device are formed; forming a bump on the top part of the metal thin film layer exposed to the regions where the electrode pads of the semiconductor image pickup device are formed; removing the photosensitive film and then etching the metal thin film layer using the bump as a mask; and removing the stress preventing polymer layer formed on the image sensing unit where the functional polymer layer is formed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

A structure of a package for a semiconductor image pickup device in accordance with the present invention and a fabrication method thereof will be described in detail with reference to the accompanying drawings.

FIGS. 4 to 9 are exemplified views sequentially showing a fabrication method of a structure of a package for a semiconductor image pickup device in accordance with a first embodiment of the present invention.

Figure 4:
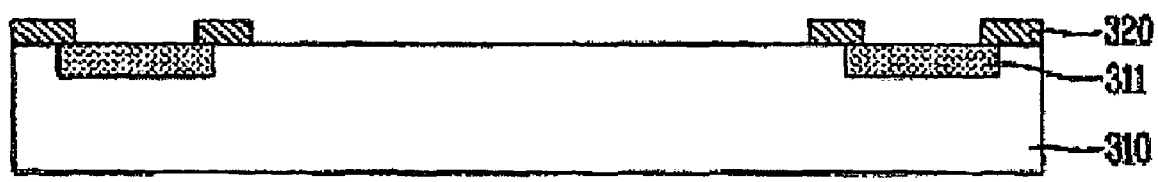
FIGS. 4 to 9 are exemplified views sequentially showing a fabrication method of a structure of a package for a semiconductor image pickup device in accordance with a first embodiment of the present invention.

First, as shown in FIG. 4, an insulating film 320 is formed on the surface of a semiconductor image pickup device 310 and then the insulating film 320 is selectively etched so as to expose electrode pads 311 formed on the edges of the semiconductor image pickup device 310 and an image sensing unit (not shown) formed at the center of the semiconductor image pickup device 310.

Figure 5:
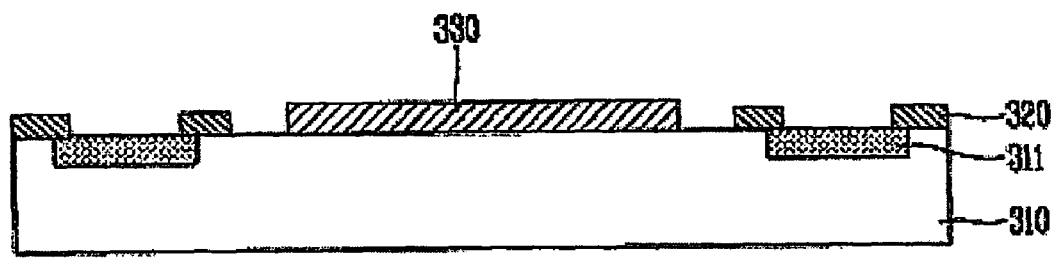

As shown in FIG. 5, a functional polymer layer 330 is selectively formed on the image sensing unit formed at the center of the semiconductor image pickup device 310. At this time, as the functionally polymer layer 330, a planarization layer, a color filter layer and a micro lens are stacked so that the semiconductor image pickup device 310 have optical characteristics.

Figure 6:
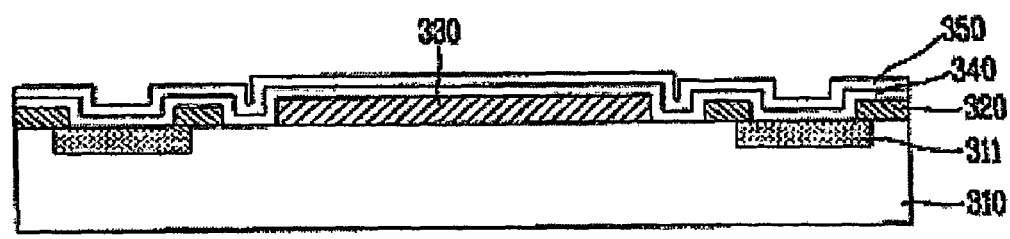

As shown in FIG. 6, a metallic bonding layer 340 and a metal layer for plating 350 are sequentially deposited on the top part of the resultant material.

The metallic bonding layer 340 is made of metal such as Ti, Al or Cr, superior in adhesion force to the insulating layer 320 and the electrode pads 311, at a thickness of 100 to 5000 Å, or is made of an alloy containing at least one of Ti, Al and Cr at a thickness of 100 to 5000 Å. At this time, the metallic bonding layer 340 is made of Ti or Ti base alloy superior in adhesion force to other metal.

The metal layer for plating 350 is made of metal such as Au, Cu or Ni, superior in electric conductivity, at a thickness of 100 to 5000 Å, or is made of an alloy containing at least one of Au, Cu and Ni at a thickness of 100 to 5000 Å. At this time, the metal layer for plating 350 is made of metal such as Au superior in electric conductivity and oxidation resistance to other metal.

Meanwhile, in case where a bump 370 to be formed later is made of solder, the metal layer for plating 350 is made of metal such as Cu or Ni. In case where metal such as Cu or Ni is applied, solder or metal similar thereto is coated at a thickness of 1 to 15 μm before a bump 370 made of solder is formed, thereby improving the reliability of the bump 370 made of solder.

As stated above, conventionally, as the thin film process of depositing a metallic bonding layer 340 and a metal layer for plating 350 is carried out under the temperature condition of a high temperature from 200 to 300° C. or higher, there occurs a problem that the characteristics of the functional polymer layer 330 formed on the surface of the semiconductor image pickup device 310 are deteriorated, and also the surface of the semiconductor image pickup device 310 is deformed to generate a crack or wrinkle.

Therefore, in the fabrication method of the structure of the package for the semiconductor image pickup device in accordance with the first embodiment, in order to suppress the deterioration of the characteristics of the functional polymer layer 330 formed on the surface of the semiconductor image pickup device 310 and the surface deformation of the semiconductor image pickup device 310, the metallic bonding layer 340 and the metal layer for plating 350 are deposited while keeping the surface temperature of the semiconductor image pickup device 310 at the range between a room temperature and 200° C. At this time, it is preferred to keep the surface temperature of the semiconductor image pickup device 310 at 50 to 180° C. so as not to exceed 180° C.

As described above, in order to keep the surface temperature of the semiconductor image pickup device 310 at the range between a room temperature and 200° C., the method of adjusting the pressure and electric power used in the thin film process of depositing the metallic bonding layer 340 and the metal layer for plating 350 can be utilized.

The pressure and electric power used in the thin film process for keeping the surface temperature of the semiconductor image pickup device 310 at the range between a room temperature and 200° C. can be set to a variety of ranges according to an equipment specification. For example, a thin film fabrication equipment of such a type to be loaded on a supporting plate and transported is set to have an electric power range of 0.5 to 5 KW and a pressure range of 2 to 15 mTorr. Especially, in the electric power range of 1 to 3 KW and the pressure range of 5 to 10 mTorr, a thin film can be deposited more effectively while keeping the surface temperature of the semiconductor image pickup device 310 at 50 to 180° C. so as not to exceed 180° C.

Further, a thin film fabrication equipment of such a type to be loaded and fixed to a support is set to have an electric power range of 50 to 1500 W and a pressure range of 2 to 15 mTorr. Especially, in the electric power range of 100 to 7000 KW and the pressure range of 5 to 10 mTorr, a thin film can be deposited more effectively while keeping the surface temperature of the semiconductor image pickup device 310 at 50 to 180° C. so as not to exceed 180° C.

Meanwhile, in order to keep the surface temperature of the semiconductor image pickup device 310 at the range between a room temperature and 200° C., the method of improving the structure and contact state of the supporting plate or support, on which the semiconductor image pickup device 310 is loaded, during the thin film process of depositing the metallic bonding layer 340 and the metal layer for plating 350, can be utilized.

Figure 10:
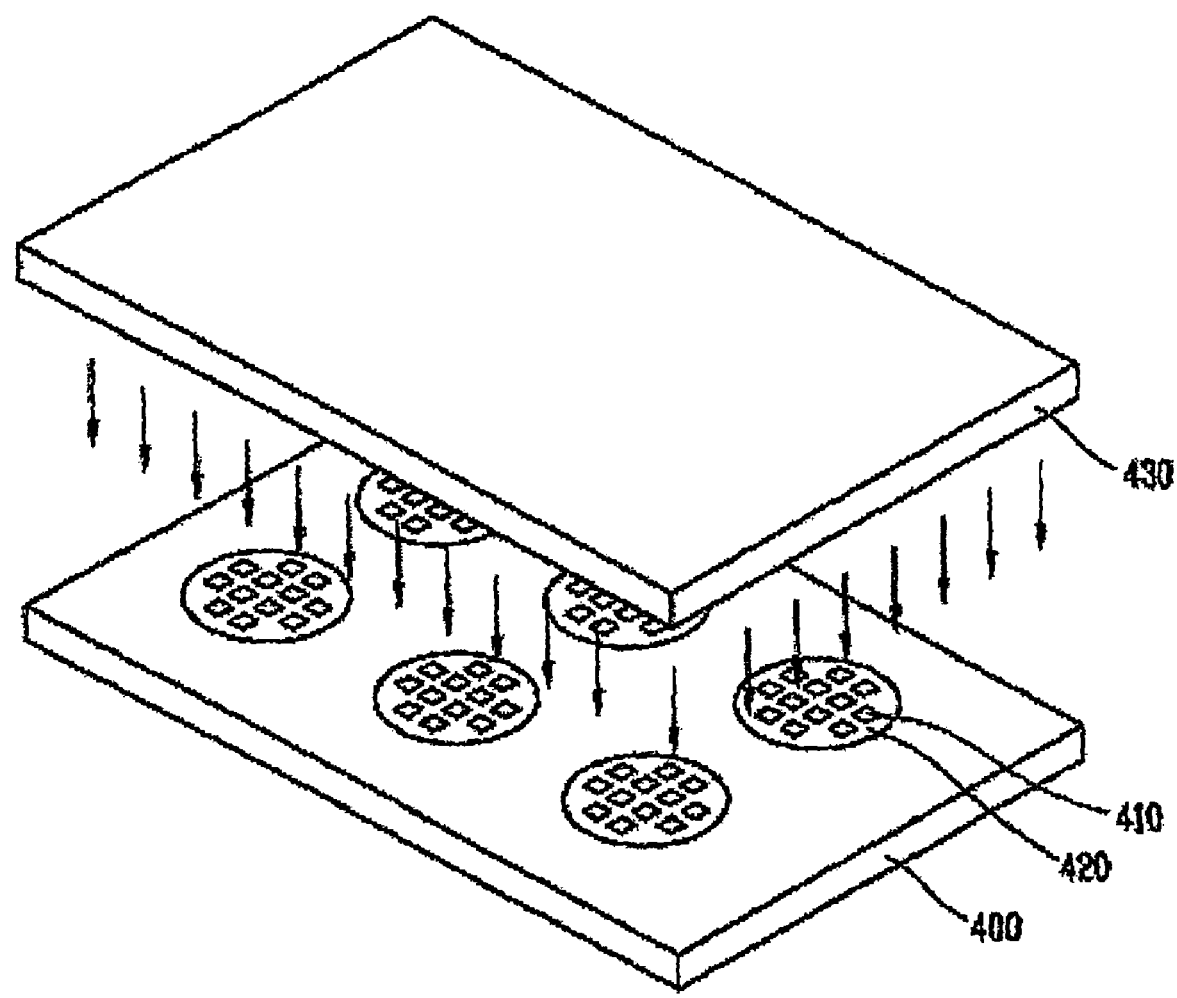
FIG. 10 is an exemplified view showing the case where the thin film process is carried out with the semiconductor image pickup device loaded on a supporting plate in FIG. 6.
Figure 11:
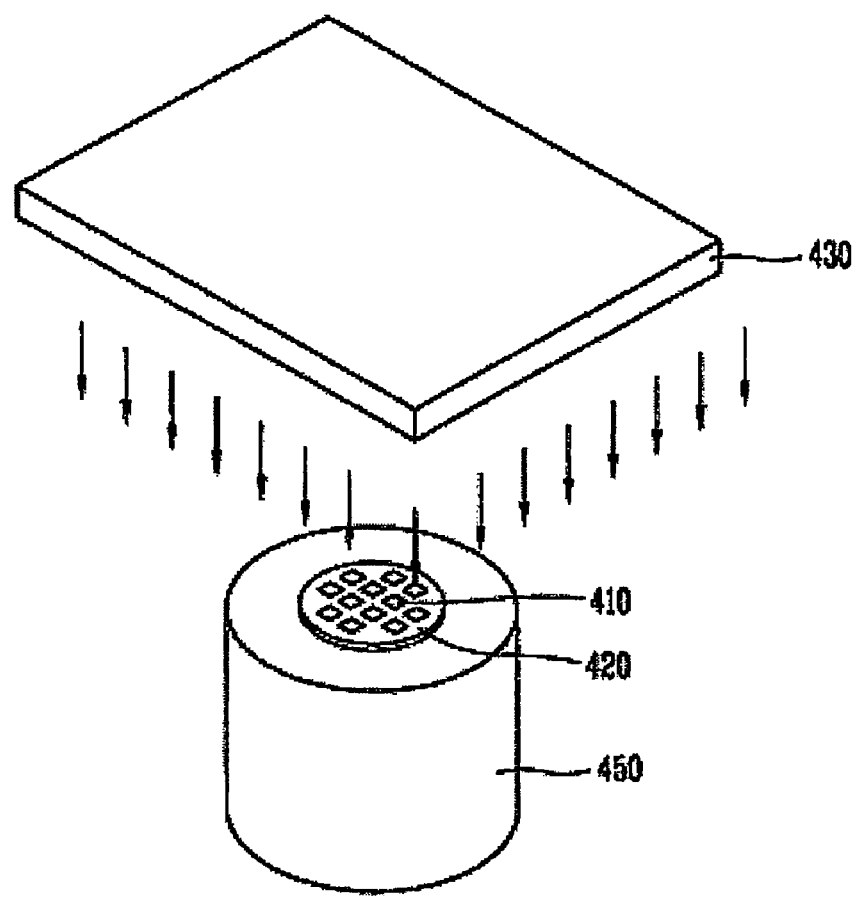
FIG. 11 is an exemplified view showing the case where the thin film process is carried out with the semiconductor image pickup device loaded on a support in FIG. 6.

FIG. 10 is an exemplified view showing the case where the thin film process is carried out with the semiconductor image pickup device loaded on a supporting plate, and FIG. 11 is an exemplified view showing the case where the thin film process is carried out with the semiconductor image pickup device loaded on a support. As shown therein, a plurality of substrates 420 having semiconductor image pickup devices 410 is loaded on a flat-plate supporting plate 400 or on a cylindrical support 450 and then the supporting plate 400 or the support 450 is moved so as to be located below a metal material 430, and the metal material 430 is deposited while the supporting plate 400 or the support 450 being stopped or transported in one direction, thereby forming a thin film such as the metallic bonding layer 340 and the metal layer for plating 350. At this time, a high temperature of 200 to 300° C. or higher generated during the process of depositing the metal material 430 is spread by improving the structure and contact state of the supporting plate 400 or support 450 on which the semiconductor image pickup device 410 is loaded.

Figure 12:
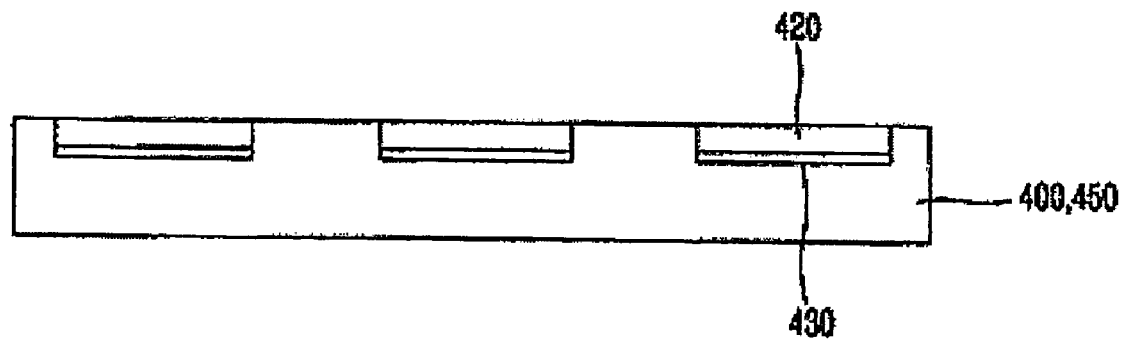
FIG. 12 is an exemplified view showing a first example of the planar construction of the supporting plate and support in FIGS. 10 and 11.

FIG. 12 is an exemplified view showing a first example of the planar construction of the supporting plate 400 and support 450. As shown therein, the supporting plate 400 or support 450 on which the semiconductor image pickup device 410 is loaded can be manufactured of Al or Al base alloy, Cu or Cu base alloy or Fe or Fe base alloy. By forming a silicon base polymer 430 superior in heat conductivity on the regions contacting the substrate 420 where the semiconductor image pickup device 410 is formed, the heat generated in the thin film process can be spread. Thus, the surface temperature of the semiconductor image pickup device 41 can be kept at the range between a room temperature and 200° C.

Figure 13:
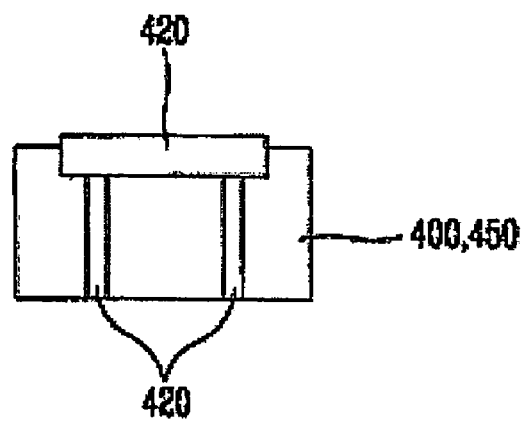
FIG. 13 is an exemplified view showing a second example of the planar construction of the supporting plate and support in FIG. 10 and 11.

FIG. 13 is an exemplified view showing a second example of the planar construction of the supporting plate 400 and support 450. As shown therein, the supporting plate 400 or support 450 on which the semiconductor image pickup device 410 is loaded can be manufactured of Al or Al base alloy, Cu or Cu base alloy or Fe or Fe base alloy. By forming a water cooled tube (not shown) on the regions contacting the substrate 420 where the semiconductor image pickup device 410 is formed, the heat generated in the thin film process can be spread more efficiently as compared to the first example of FIG. 6. Thus, the surface temperature of the semiconductor image pickup device 410 can be kept at the range between a room temperature and 200° C.

Figure 7:
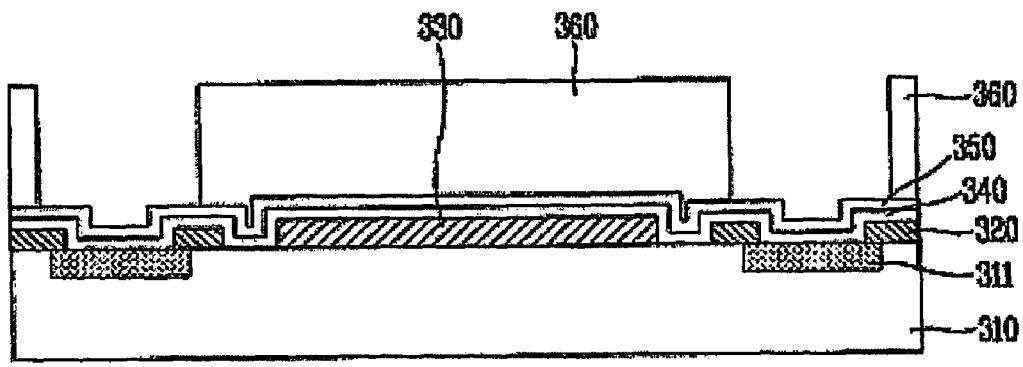

As shown in FIG. 7, a photosensitive film 360 is formed on the top part of the metal layer for plating 350 and then exposed to light and developed so as to expose the metal layer for plating 350 of the regions where the electrode pads 311 of the semiconductor image pickup device 310 are formed.

Figure 8:
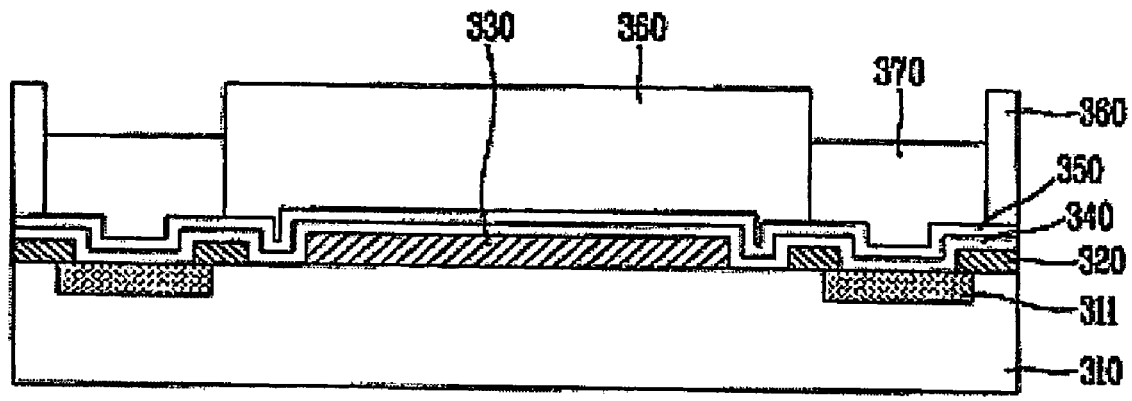

As shown in FIG. 8, a bump 370 is formed on the top part of the metal layer for plating 350 exposed to the regions where the electrode pads 311 of the semiconductor image pickup device 310 are formed. At this time, the bump 370 is made of one selected from the group consisting of Au, solder and Cu.

Figure 9:
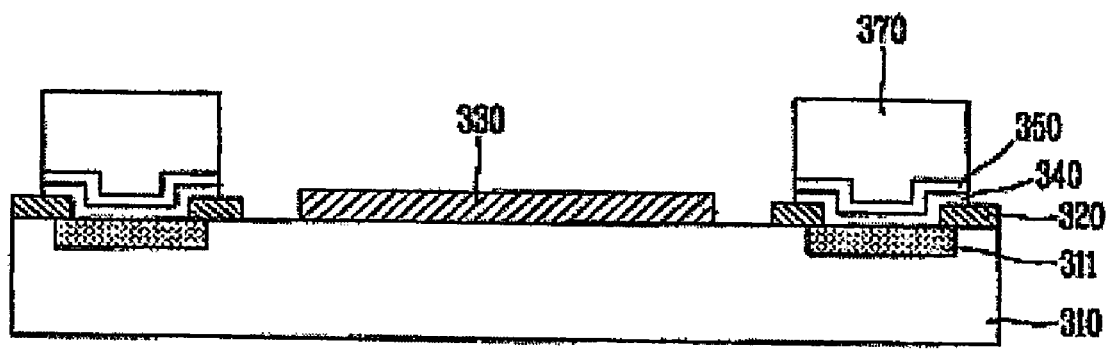

As shown in FIG. 9, the residual photosensitive film 360 is removed and then the metal layer for plating 350 and the metallic bonding layer 340 are etched using the bump 370 as a mask.

FIGS. 14 to 21 are exemplified views sequentially showing a fabrication method of a structure of a package for a semiconductor image pickup device in accordance with a second embodiment of the present invention.

Figure 14:
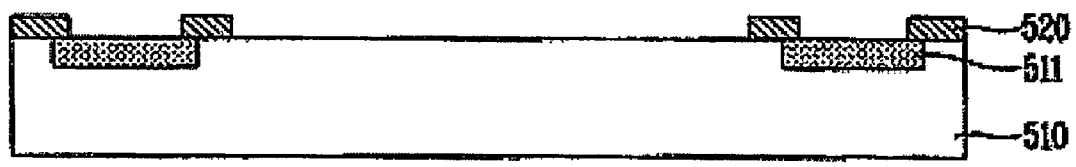
FIGS. 14 to 21 are exemplified views sequentially showing a fabrication method of a structure of a package for a semiconductor image pickup device in accordance with a second embodiment of the present invention.

First, as shown in FIG. 14, an insulating film 520 is formed on the surface of a semiconductor image pickup device 510 and then the insulating film 520 is selectively etched so as to expose electrode pads 511 formed on the edges of the semiconductor image pickup device 510 and an image sensing unit (not shown) formed at the center of the semiconductor image pickup device 510.

Figure 15:
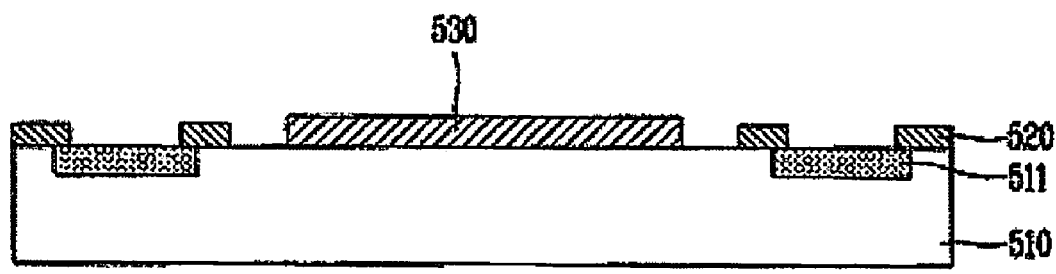

As shown in FIG. 15, a functional polymer layer 530 is selectively formed on the image sensing unit formed at the center of the semiconductor image pickup device 510. At this time, as the functionally polymer layer 530, a planarization layer, a color filter layer and a micro lens are stacked so that the semiconductor image pickup device 510 have optical characteristics.

Figure 16:
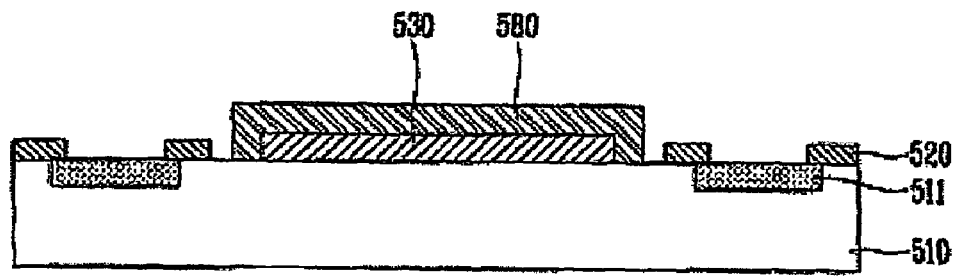

As shown in FIG. 16, a stress preventing polymer layer 580 is formed on the image sensing unit where the functional polymer 530 is formed. At this time, the stress preventing polymer layer 580 can be made of a photosensitive film, and can be selectively formed on the image sensing unit by means of coating, exposing and developing of the photosensitive film. Besides, the stress preventing polymer layer 580 can be made of a polymer material superior in etching selectivity with respect to the functional polymer layer 530.

The functional polymer layer 530 and the stress preventing polymer layer 580 are sequentially formed, and then simultaneously patterned by the coating, light exposure and development of the photosensitive film used as the stress preventing polymer layer 580 and formed on the image sensing unit.

Figure 17:
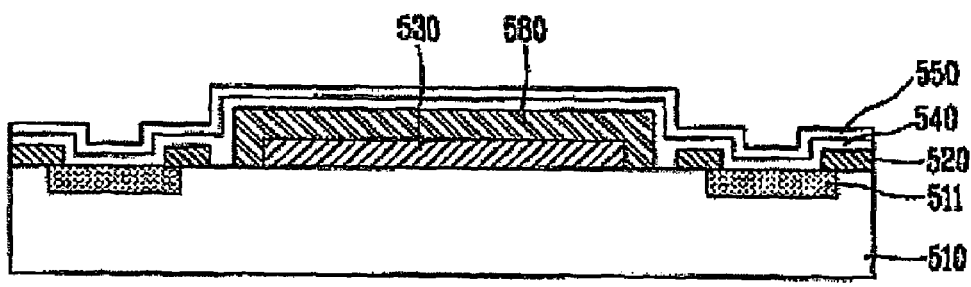

As shown in FIG. 17, a metallic bonding layer 540 and a metal layer for plating 550 are sequentially deposited on the top part of the resultant material.

The metallic bonding layer 540 is made of metal such as Ti, Al or Cr, superior in adhesion force to the insulating layer 520 and the electrode pads 511, at a thickness of 100 to 5000 Å, or is made of an alloy containing at least one of Ti, Al and Cr at a thickness of 100 to 5000 Å. At this time, the metallic bonding layer 540 is made of Ti or Ti base alloy superior in adhesion force to other metal.

The metal layer for plating 550 is made of metal such as Au, Cu or Ni, superior in electric conductivity, at a thickness of 100 to 5000 Å, or is made of an alloy containing at least one of Au, Cu and Ni at a thickness of 100 to 5000 Å. At this time, the metal layer for plating 550 is made of metal such as Au superior in electric conductivity and oxidation resistance to other metal.

Meanwhile, in case where a bump 570 to be formed later is made of solder, the metal layer for plating 550 is made of metal such as Cu or Ni. In case where metal such as Cu or Ni is applied, solder or metal similar thereto is coated at a thickness of 1 to 15 μm before a bump 570 made of solder is formed, thereby improving the reliability of the bump 570 made of solder.

As stated above, conventionally, as the stress of the metallic bonding layer 540 and metal layer for plating 550 generated in the thin film process of depositing the metallic bonding layer 540 and the metal layer for plating 550 exceeds the maximum tensile strength (400 MPa) at which polymer material can endure without deformation, there occurs a problem that the surface of the semiconductor image pickup device 510 is deformed to generate a crack or wrinkle. For instance, TiW mainly used as the metallic bonding layer 540 has the stress distribution of 500 MPa to 1 GPa.

Subsequently, in the fabrication method of the structure of the package for the semiconductor image pickup device in accordance with the second embodiment of the present invention, a stress preventing polymer layer 580 is formed on the image sensing unit, where the functional polymer layer 530 is formed, so that the stress preventing polymer layer 580 absorbs the stress of the metallic bonding layer 540 and metal layer for plating 550 generated in the thin film process of depositing the metallic bonding layer 540 and the metal layer for plating 550 to protect the functionally polymer layer 530 of the semiconductor image pickup device 510.

Figure 18:
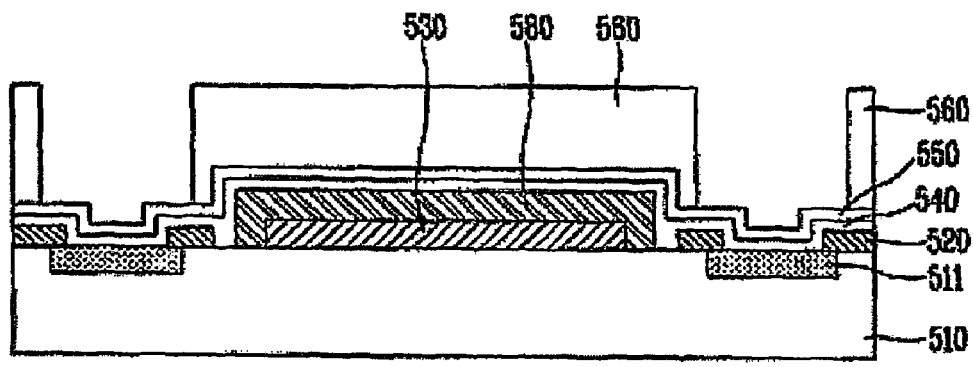

As shown in FIG. 18, a photosensitive film 560 is formed on the top part of the metal layer for plating 550 and then exposed to light and developed so as to expose the metal layer for plating 550 of the regions where the electrode pads 511 of the semiconductor image pickup device 510 are formed.

Figure 19:
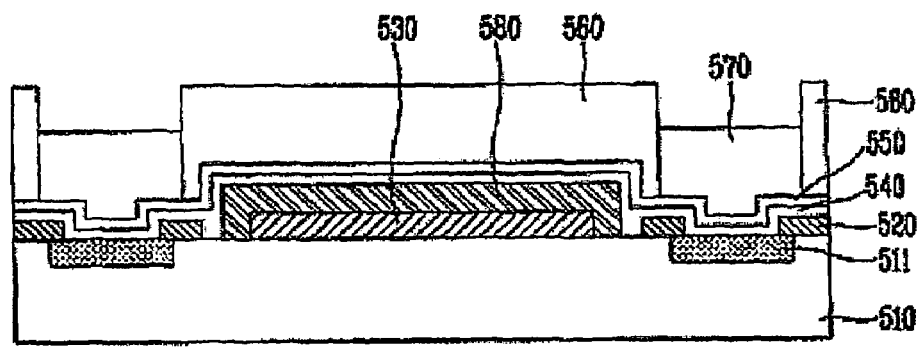

As shown in FIG. 19, a bump 570 is formed on the top part of the metal layer for plating 550 exposed to the regions where the electrode pads 511 of the semiconductor image pickup device 510 are formed. At this time, the bump 570 is made of one selected from the group consisting of Au, solder and Cu.

Figure 20:
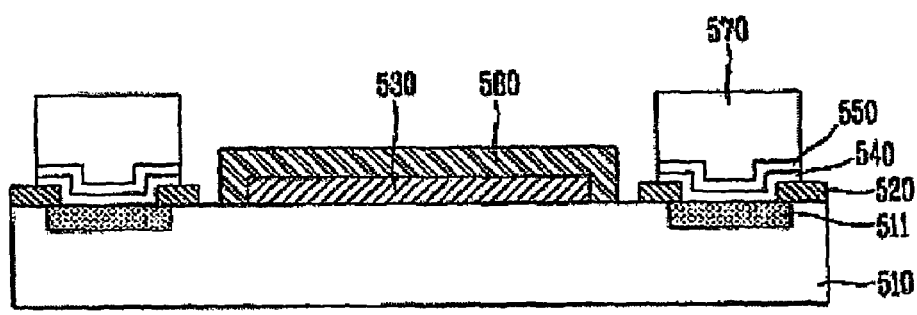

As shown in FIG. 20, the residual photosensitive film 560 is removed and then the metal layer for plating 550 and the metallic bonding layer 540 are etched using the bump 570 as a mask.

Figure 21:
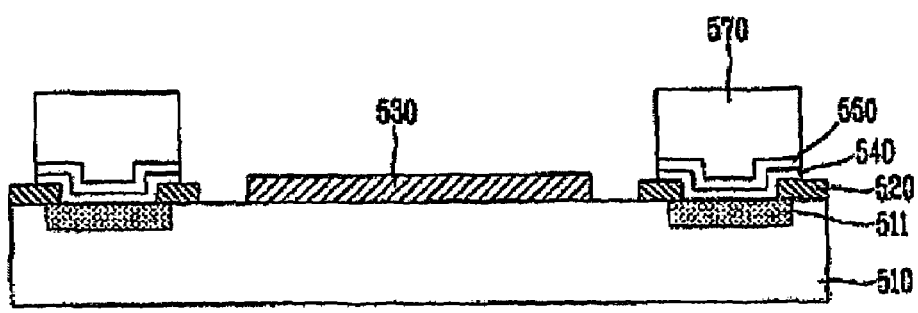

As shown in FIG. 21, the stress preventing polymer layer 580 formed on the image sensing unit where the functionally polymer layer 530 is formed is selectively removed. At this time, in case where a photosensitive material is used as the stress preventing polymer layer 580, it can be selectively removed by means of reexposure to light and development. On the other hand, in case where polymer superior in etching selectivity with respect to the functionally polymer layer 530 is used as the stress preventing polymer layer 580, it can be selectively removed by a corresponding etching solution.

The above-described semiconductor image pickup device 310 with a bump 370 in accordance with the first embodiment of the present invention and the above-described semiconductor image pickup device 510 with a bump 570 in accordance with the second embodiment of the present invention resultantly have the same structure. The first and second embodiments of the present invention are applicable either alone or in combination if needed.

FIGS. 22 to 25 are exemplified views sequentially showing an assembly process of mounting a semiconductor image pickup device with a bump in accordance with the first or second embodiment of the present invention.

Figure 22:
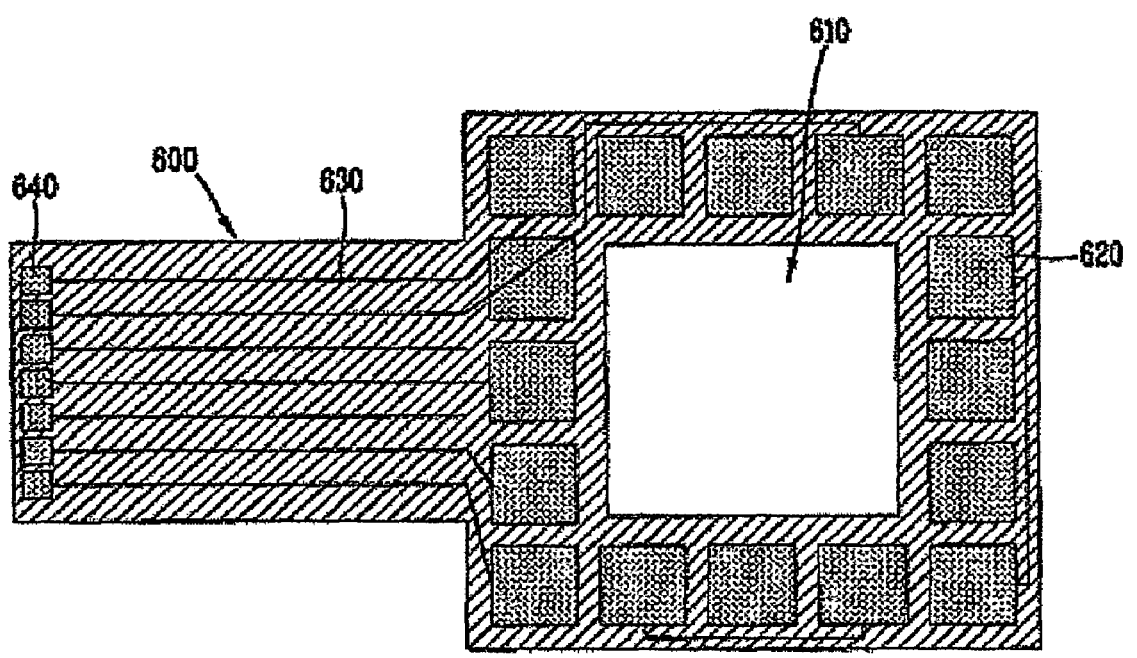
FIGS. 22 to 25 are exemplified views sequentially showing an assembly process of mounting a semiconductor image pickup device with a bump in accordance with the first or second embodiment of the present invention.
Figure 22:
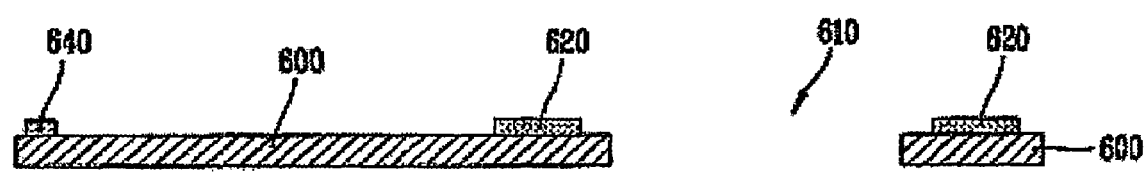

First, as shown in FIG. 22, a printed circuit board 600 for mounting a semiconductor image pickup device with a bump thereon has an opening 610 so as to expose an image sensing unit provided at the center of the semiconductor image pickup device, a plurality of electrode pads 620 being formed along the edges of the opening 610. At this time, the plurality of electrode pads 620 is electrically connected to external system interfacing electrode pads 640 via a plurality of circuit patterns 630 extending in one direction of the printed circuit board 600.

Figure 23:
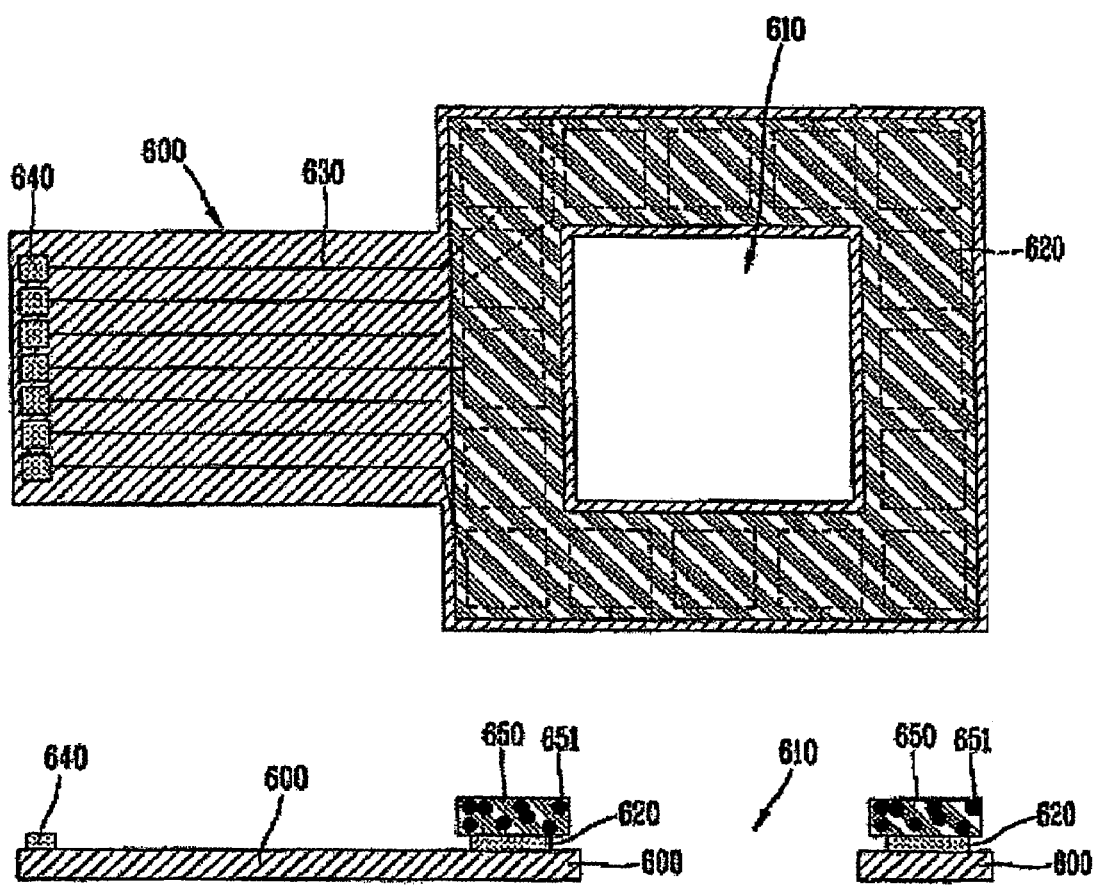

As shown in FIG. 23, an anisotropic conductive polymer 650 is formed along the edges of the opening 610 where the plurality of electrode pads 620 is formed.

The anisotropic conductive polymer 650 can be made in various shapes and materials, for instance, a liquid anisotropic conductive adhesive (ACA) or a solid anisotropic conductive film (ACF) semi-hardened and having a predetermined shape.

Additionally, the anisotropic conductive polymer 650 is mainly comprised of a thermosetting resin, a thermoplastic resin or a combination thereof, and contains a predetermined amount of spherical or square conductive metal balls 651 made of Au, Ni, Ag or Cu uniformly distributed. At this time, the particle size of the conductive metal balls 651 is dependent upon the spacing between the electrode pads 620, generally, 0.5 to 10 μm.

Figure 24:
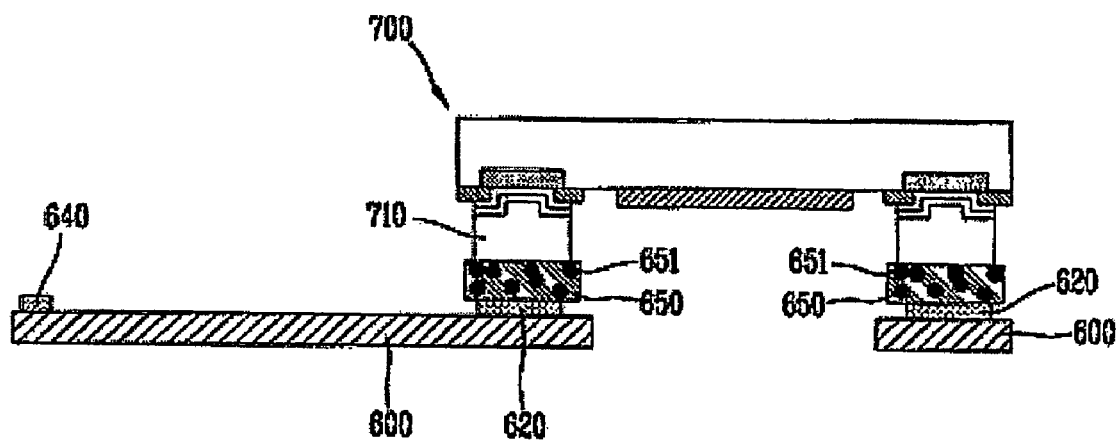

As shown in FIG. 24, the anisotropic conductive polymer 650 is compressed at a temperature between several tens and 200° C., being sandwiched between the plurality of electrode pads 620 of the printed circuit board 600 and bumps 710 formed at the semiconductor image pickup device 700, to flow the resin component of the anisotropic conductive polymer 650 and then harden it by being preserved for several seconds to a few minutes. Therefore, the plurality of electrode pads 620 of the printed circuit board 600 and the bumps 710 formed at the semiconductor image pickup device 700 are electrically contacted by means of the conductive metal balls 651 contained in the anisotropic conductive polymer 650. And, the resin component of the anisotropic conductive polymer 650 is hardened and mechanically adhered to the edges of the opening 610 of the printed circuit board 600 where the plurality of electrode pads 620 is not formed and to the edges of the image sensing unit of the semiconductor image pickup device 700 where the bumps 710 are not formed.

Meanwhile, after the anisotropic conductive polymer 650 is compressed at a temperature between several tens and 200° C. and then hardened by being preserved for several seconds to a few minutes, the anisotropic conductive polymer 650 may be additionally hardened by re-heating.

Figure 25:
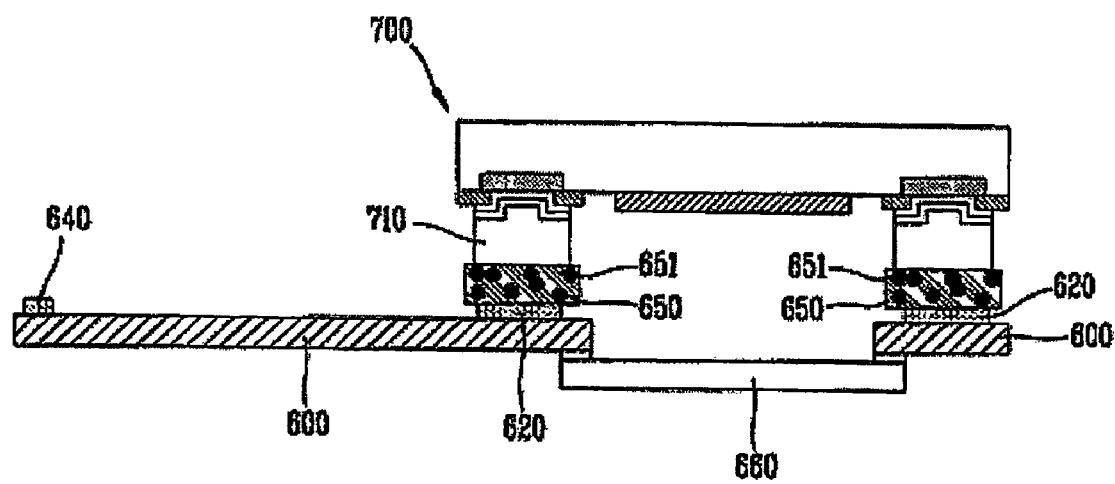

As shown in FIG. 25, a glass filter 660 is attached to the edges of the opening 616 of the printed circuit board 600 by an adhesive 661. At this time, the glass filter 660 allows a light of a specific wavelength region to be incident upon the image sensing unit of the semiconductor image pickup device 700 through the opening 610 of the printed circuit board 600. And, the glass filter 660 is attached under an inert gaseous atmosphere so as to seal and protect the image sensing unit of the semiconductor image pickup device 700 under the inert gaseous atmosphere.

Figure 26:
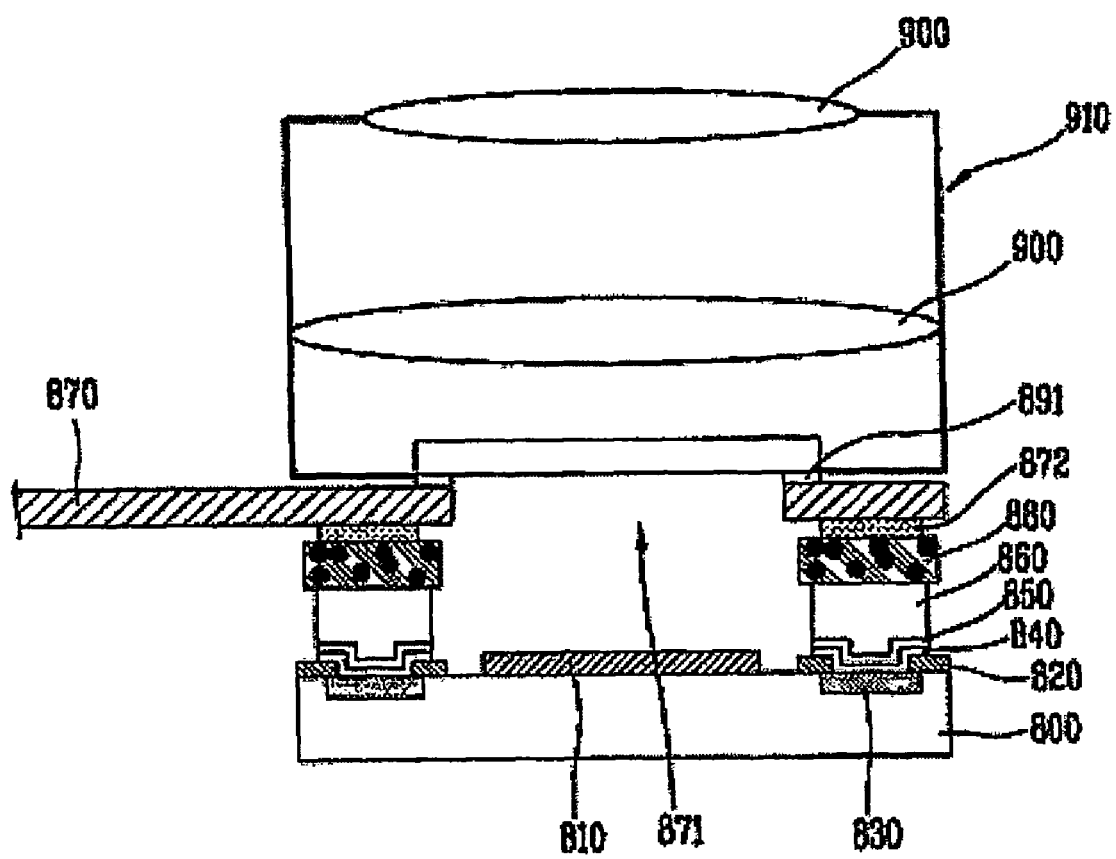
FIG. 26 is an exemplified view showing the module of a semiconductor image sensor in which a lens unit is coupled to the package of the semiconductor image pickup device fabricated in accordance with the first or second embodiment of the present invention.

FIG. 26 is an exemplified view showing the module of a semiconductor image sensor in which a lens unit is coupled to the package of the semiconductor image pickup device fabricated in accordance with the first or second embodiment of the present invention. As shown therein, the module of the semiconductor image sensor comprises: a semiconductor image pickup device 800 having a functional polymer layer 810, comprised of a planarization layer, a color filter layer and a micro lens stacked thereto, formed on the surface of an image sensing unit at the center thereof, and having a plurality of electrode pads 830 selectively exposed by an insulating film 820 formed along the edges; a metallic bonding layer 840 and a metal layer for plating 850 formed on the respective top parts of the exposed electrode pads 830; a bump 860 formed on the respective top parts of the metal layer for plating 850; a printed circuit board 870 provided with an opening 871 so as to expose the functional polymer layer 810 and a plurality of electrode pads 872 bonding to the bump 860 via an anisotropic conductive polymer 880; a glass filter 890 attached on the printed circuit board 870 by an adhesive 891 and filtering the light incident upon the image sensing unit of the semiconductor image pickup device 810 through the opening 871; and a lens unit 900 disposed on the printed circuit board 870. At this time, the lens unit 900 is held by a lens holder 910 supported on the printed circuit board 870 and is provided at the top part of the image sensing unit of the semiconductor image pickup device 800.

Consequently, the module of the semiconductor image sensor fabricated by the flip chip bumping in accordance with the first or second embodiment of the present invention has the same size as the semiconductor image pick device 800, thus it is made possible to sharply reduce the module size of the semiconductor image sensor.

Although the invention has been described with respect to the semiconductor image pickup device, the appended claims are not to be thus limited but may be very effectively applicable to the field of packaging a semiconductor device with a polymer layer formed on the surface by means of flip chip bumping and are to be construed as embodying all modifications and alternative constructions that may occur to one skilled in the art which fairly fall within the basic teaching herein set forth.

As described above, in the structure of a package for a semiconductor image pickup device and the fabrication method thereof, the structure of the package is fabricated by using flip chip bumping. During a thin film process of depositing a metallic bonding layer and a metal layer for plating, the surface of a semiconductor image pickup device is maintained at the range between a room temperature and 200° C. A stress preventing polymer can absorb stress generated during the thin film process. Accordingly, a functional polymer layer on the surface of a semiconductor image pickup device can be prevented from being deteriorated in its properties and from being deformed at its surface.

Accordingly, the structure of the package for the semiconductor image pickup device fabricated by the flip chip bumping can be prevented from being deteriorated in its optical characteristics due to a damage of the surface of the semiconductor image pickup device.

Furthermore, according to the structure of the package for the semiconductor image pickup device and its fabrication method thereof of the present invention, the module of the semiconductor image sensor is able to be fabricated by the flip chip bumping, thus it is made possible to fabricate the module of the semiconductor image sensor in the same size as the semiconductor image pickup device. This leads to the sharp reduction of the module size of the semiconductor image pickup, thereby being able to cope with the miniaturization trend of the product very effectively. Moreover, the invention provides a simple process and time saving as compared with the conventional fabrication method of a structure of a package for a semiconductor image pickup device utilizing wire bonding.

What is claimed is:

1. A fabrication method of a structure of a package for a semiconductor image pickup device, comprising the steps of:
   forming an insulating film on the surface of a semiconductor image pickup device and then selectively etching the insulating film so as to expose electrode pads formed on the edges of the semiconductor image pickup device;
   forming at least one functional polymer layer on an image sensing unit formed at the center of the semiconductor image pickup device;
   forming at least one metal thin film layer on the top part of the resultant material while adjusting the surface temperature of the semiconductor image pickup device at the range between a room temperature and 200° C.;
   forming a photosensitive film on the top part of the metal thin film layer and then light-exposing and developing the same so as to expose the metal thin film layer of the regions where the electrode pads of the semiconductor image pickup device are formed;
   forming a bump on the top part of the metal thin film layer exposed to the regions where the electrode pads of the semiconductor image pickup device are formed; and
   removing the photosensitive film and then etching the metal thin film layer using the bump as a mask.

2. The method of claim 1, wherein the functional polymer layer is comprised of a planarization layer, a color filter layer and a micro lens.

3. The method of claim 1, wherein the metal thin film layer is comprised of a stack of a metallic bonding layer and a metal layer for plating.

4. The method of claim 3, wherein the metallic bonding layer is made of metal such as Ti, Al or Cr or made of an alloy containing at least one of Ti, Al and Cr.

5. The method of claim 3, wherein the metallic bonding layer is formed at a thickness of 100 to 5000 Å.

6. The method of claim 3, wherein the metal layer for plating is made of metal such as Au, Cu or Ni or made of an alloy containing at least one of Au, Cu and Ni.

7. The method of claim 3, wherein the metal layer for plating is formed at a thickness of 100 to 5000 Å.

8. The method of claim 1, wherein the bump is made of one selected from the group consisting of Au, solder and Cu.

9. The method of claim 1, wherein, the step of forming a metal thin film layer, the surface temperature of the semiconductor image pickup device is adjusted between 50 to 180° C.

10. The method of claim 1, wherein the surface temperature of the semiconductor image pickup device is adjusted by the pressure and electric power used in the thin film process of forming a metal thin film layer.

11. The method of claim 1, wherein the thin film process of forming a metal thin film layer comprises the steps of: loading a substrate with a plurality of semiconductor image pickup devices on a table; moving the table so as to be located below metal material; and depositing the metal material while the table being stopped or transported in one direction.

12. The method of claim 11, wherein the table is formed in a flat-plate supporting plate or on a cylindrical support.

13. The method of claim 11, wherein the table is manufactured of Al or Al base alloy, Cu or Cu base alloy or Fe or Fe base alloy.

14. The method of claim 11, wherein a silicon base polymer is formed on the surface of the table at the regions contacting the substrate where the semiconductor image pickup device is formed.

15. The method of claim 11, wherein a water cooled tube is formed inside the table at the regions contacting the substrate where the semiconductor image pickup device is formed.

16. The method of claim 11, wherein the thin film process of forming a metal thin film layer further comprises the steps of: forming an opening on the printed circuit board having a plurality of circuit patterns mounted thereto so as to expose the image sensing unit provided at the center of the semiconductor image pickup device; forming substrate electrode pads along the edges of the opening; forming an anisotropic conductive polymer along the edges of the opening; thermocompressing and hardening the anisotropic conductive polymer being sandwiched between the substrate electrode pads of the printed circuit board and the bump formed at the semiconductor image pickup device; attaching a glass filter to the edges of the opening of the printed circuit board so as to cover the opening of the printed circuit board; and mounting a lens unit on the top part of the image sensing unit of the semiconductor image pickup device.

17. The method of claim 16, wherein the anisotropic conductive polymer 650 is formed of a liquid anisotropic conductive adhesive or a solid anisotropic conductive film semi-hardened and having a predetermined shape.

18. The method of claim 16, wherein the an isotropic conductive polymer is mainly comprised of a thermosetting resin, a thermoplastic resin or a combination thereof, and contains a predetermined amount of spherical or square conductive metal balls uniformly distributed.

19. The method of claim 18, wherein the conductive metal balls are formed of one selected from the group of consisting of Au, Ni, Ag and Cu.

20. The method of claim 18, wherein the conductive metal balls have a particle size of 0.5 to 10 μm.

21. The method of claim 16, wherein, in the step of thermo-compressing and hardening the anisotropic conductive polymer, the anisotropic conductive polymer is thermocompressed at a temperature between several tens and 200° C. and then hardened by being preserved for several seconds to a few minutes.

22. The method of claim 16, wherein the thin film process of forming a metal thin film layer further comprises the step of re-heating and re-hardening the anisotropic conductive polymer after thermo-compressing and hardening the anisotropic conductive polymer.

23. The method of claim 16, wherein the step of attaching a glass filter to the edges of the opening of the printed circuit board so as to cover the opening of the printed circuit board is carried out under an inert gaseous atmosphere.

* * * * *

UNITED STATES PATENT AND TRADEMARK OFFICE
CERTIFICATE OF CORRECTION

| | | |
|---|---|---|
| PATENT NO. | : 7,491,572 B2 | Page 1 of 1 |
| APPLICATION NO. | : 10/574316 | |
| DATED | : February 17, 2009 | |
| INVENTOR(S) | : Jong-Heon Kim et al. | |

Figure 1:
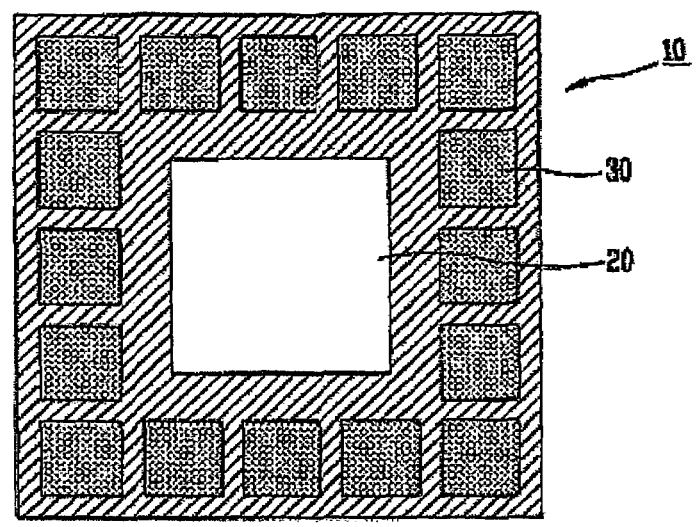
FIG. 1 is an exemplified view showing the planar construction of a general semiconductor image pickup device.
Figure 2:
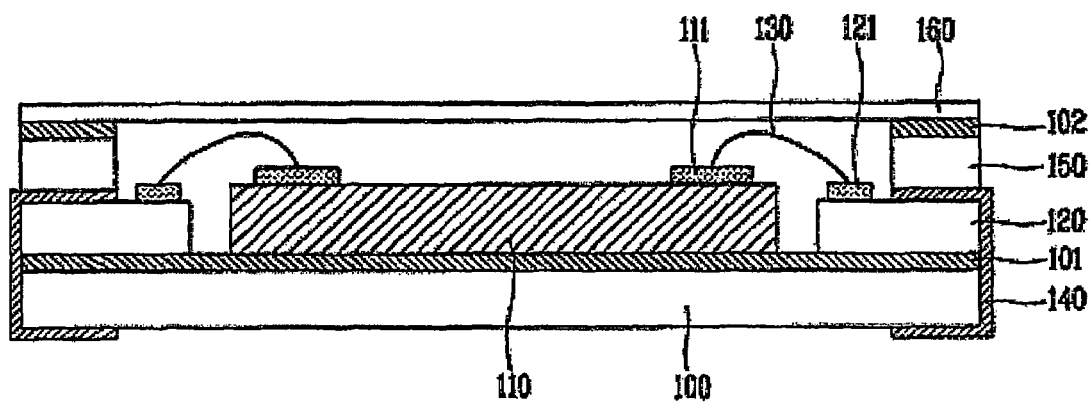
FIG. 2 is an exemplified view showing the sectional construction of the package for the semiconductor image pickup device employing the wire bonding method.
Figure 3:
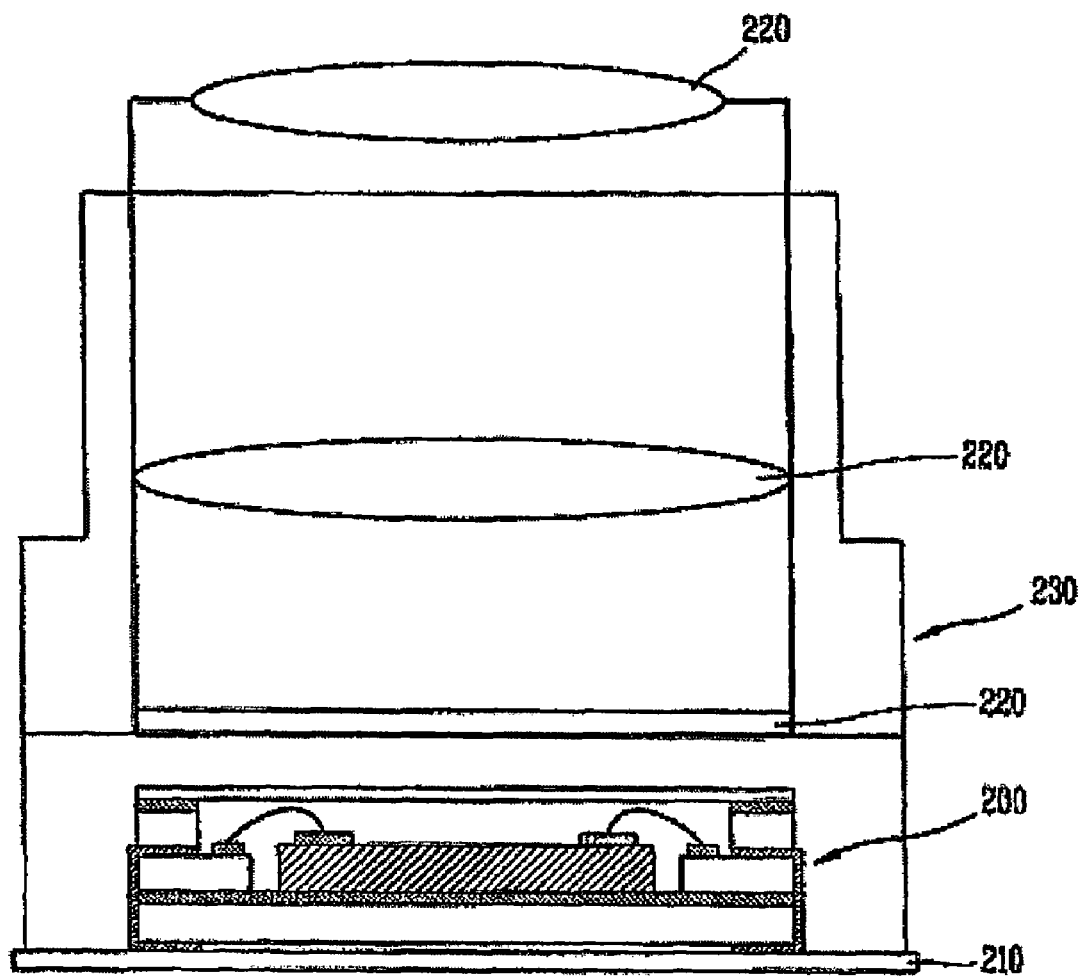
FIG. 3 is an exemplified view showing the module of a semiconductor image sensor in which a lens unit is coupled to the package of the semiconductor image pickup device as shown in FIG. 2.

It is certified that error appears in the above-identified patent and that said Letters Patent is hereby corrected as shown below:

In the drawings, sheet 1, Fig. 1 and Fig. 2, the notation "Prior Art" should be placed under the Fig. headings;

In the drawings, sheet 2, Fig. 3, the notation "Prior Art" should be placed under the Fig. heading;

Column 1, line 9, the word "disclousure" should read -- disclosure --;

Column 10, line 32, the word "616" should read -- 610 --;

Column 13, line 3, the words "an isotropic" should read -- anisotropic --.

Signed and Sealed this
First Day of February, 2011

David J. Kappos
*Director of the United States Patent and Trademark Office*